(12) United States Patent
Wang et al.

(10) Patent No.: US 6,429,734 B1
(45) Date of Patent: Aug. 6, 2002

(54) DIFFERENTIAL ACTIVE LOOP FILTER FOR PHASE LOCKED LOOP CIRCUITS

(75) Inventors: David Y. Wang, San Jose; Jyn-Bang Shyu, Cupertino, both of CA (US)

(73) Assignee: Neoaxiom Corporation, San Jose, CA (US)

( * ) Notice: Subject to any disclaimer, the term of this patent is extended or adjusted under 35 U.S.C. 154(b) by 0 days.

(21) Appl. No.: 10/024,789

(22) Filed: Dec. 19, 2001

(51) Int. Cl.$^7$ .............................. H03F 3/45; H03K 5/00
(52) U.S. Cl. ...................... 327/558; 327/552; 327/156; 330/258
(58) Field of Search ................................ 327/552, 156, 327/147, 555, 556, 557, 558; 330/305, 109, 107, 258

(56) References Cited

U.S. PATENT DOCUMENTS

| | | | |
|---|---|---|---|
| 4,007,429 A | | 2/1977 | Cadalora et al. ............... 331/17 |
| 4,355,413 A | | 10/1982 | Sato ............................ 455/183 |
| 4,697,152 A | * | 9/1987 | Estwick ....................... 327/258 |
| 4,918,399 A | * | 4/1990 | Devecchi et al. ............ 330/258 |
| 4,996,498 A | * | 2/1991 | Hanna .......................... 330/258 |
| 5,382,923 A | | 1/1995 | Shimada et al. ............... 331/8 |
| 5,783,971 A | | 7/1998 | Dekker ......................... 331/17 |
| 5,831,483 A | | 11/1998 | Fukuda ......................... 331/17 |
| 6,265,947 B1 | | 7/2001 | Klemmer et al. ............. 331/17 |

OTHER PUBLICATIONS

L. Lin et al., "A 1.4GHz Differential Low-Noise CMOS Frequency Synthesizer using a Wideband PLL Architecture", *IEEE* Int'l Solid-State Circuits Corp., Feb. 8, 2000, 2 pages.

* cited by examiner

Primary Examiner—Dinh T. Le
(74) Attorney, Agent, or Firm—Thomas Schneck; John P. McGuire, Jr.

(57) ABSTRACT

A loop filter circuit in a phase lock loop, which also includes a phase detector, a charge pump, and a voltage controlled oscillator (VCO). The loop filter circuit is comprised of two active filters and a common mode feedback control differential comparator (CMFCDC). The active filters process differential signals from the charge pump and output a pair of differential signals to the VCO. The CMFCDC provides a common mode feedback path to both active filters. The loop filter circuit eliminates common mode noise introduced by power supply and ground, and reduces phase jitter in the overall PLL circuits. Each of the active filters is comprised of two independent sets of passive elements that dictate the values of natural modes (poles) and transmission zeros (zeros) of the filtering modules. This allows PLL designers wider latitude in adjusting the unity gain bandwidth of the active loop filter, which contributes to a more stable and better performing PLL circuit.

14 Claims, 4 Drawing Sheets

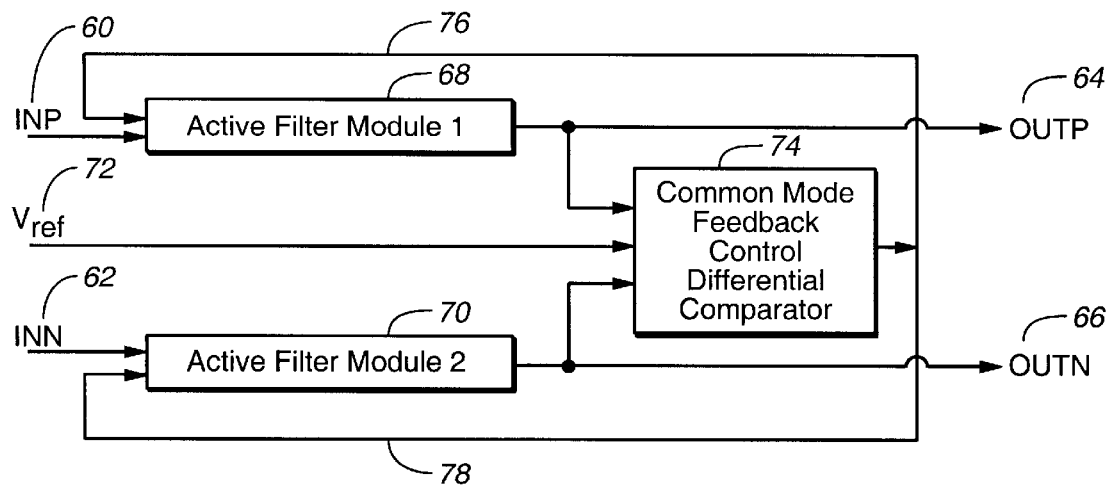
FIG._1
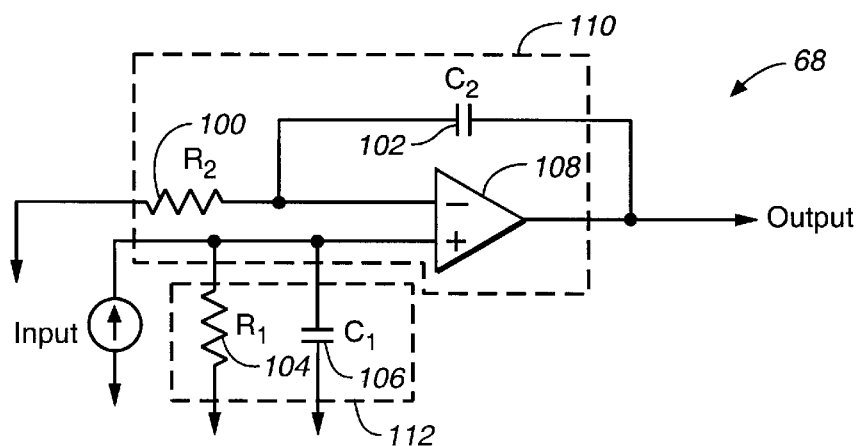
FIG._2

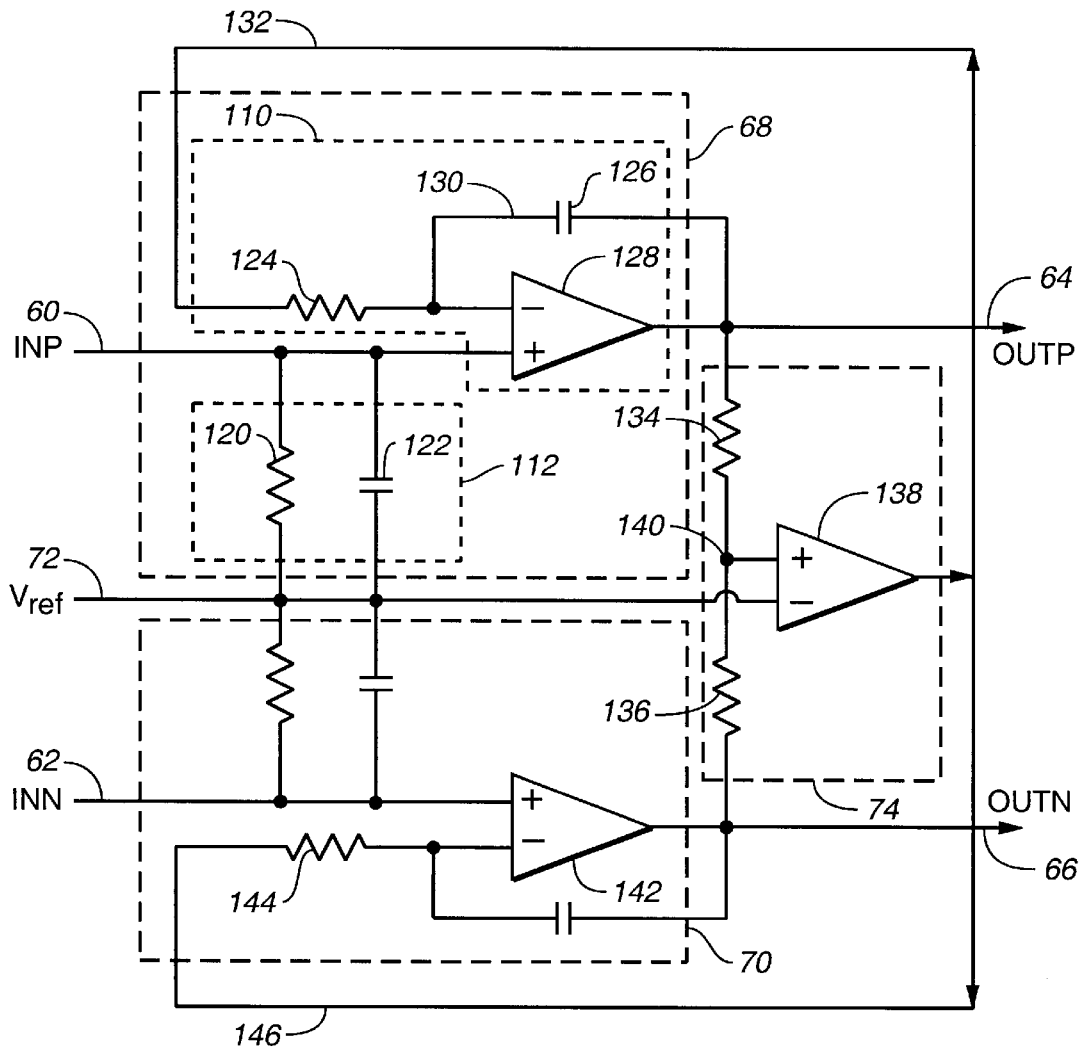
FIG._3

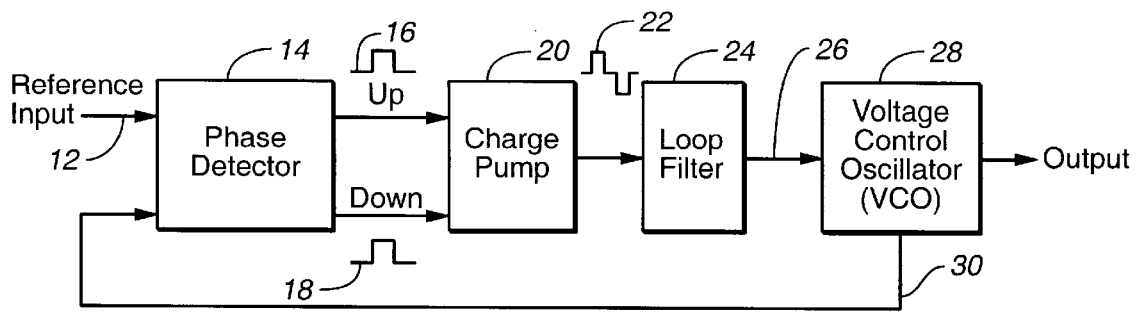
FIG._4 (PRIOR ART)
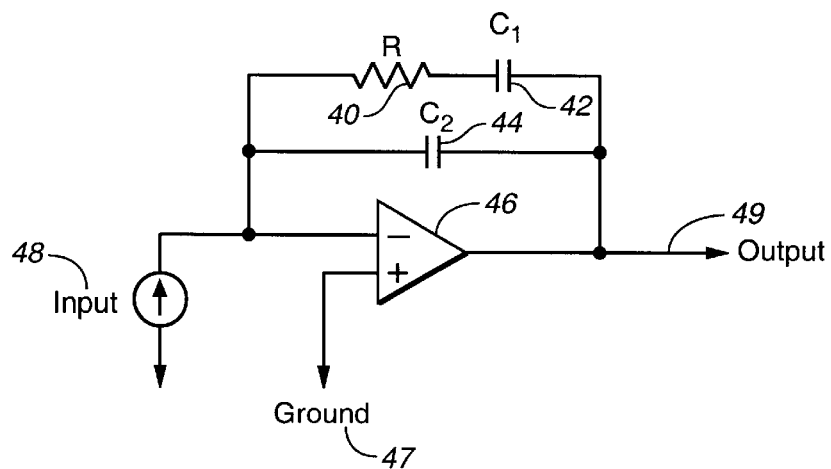
FIG._5 (PRIOR ART)
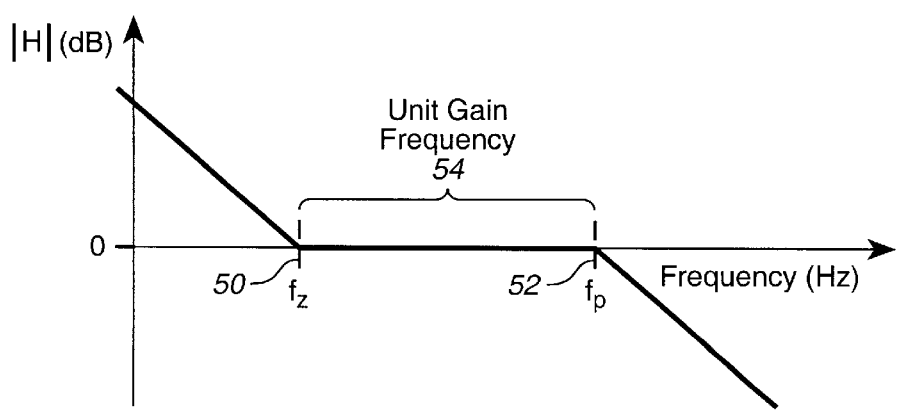
FIG._6

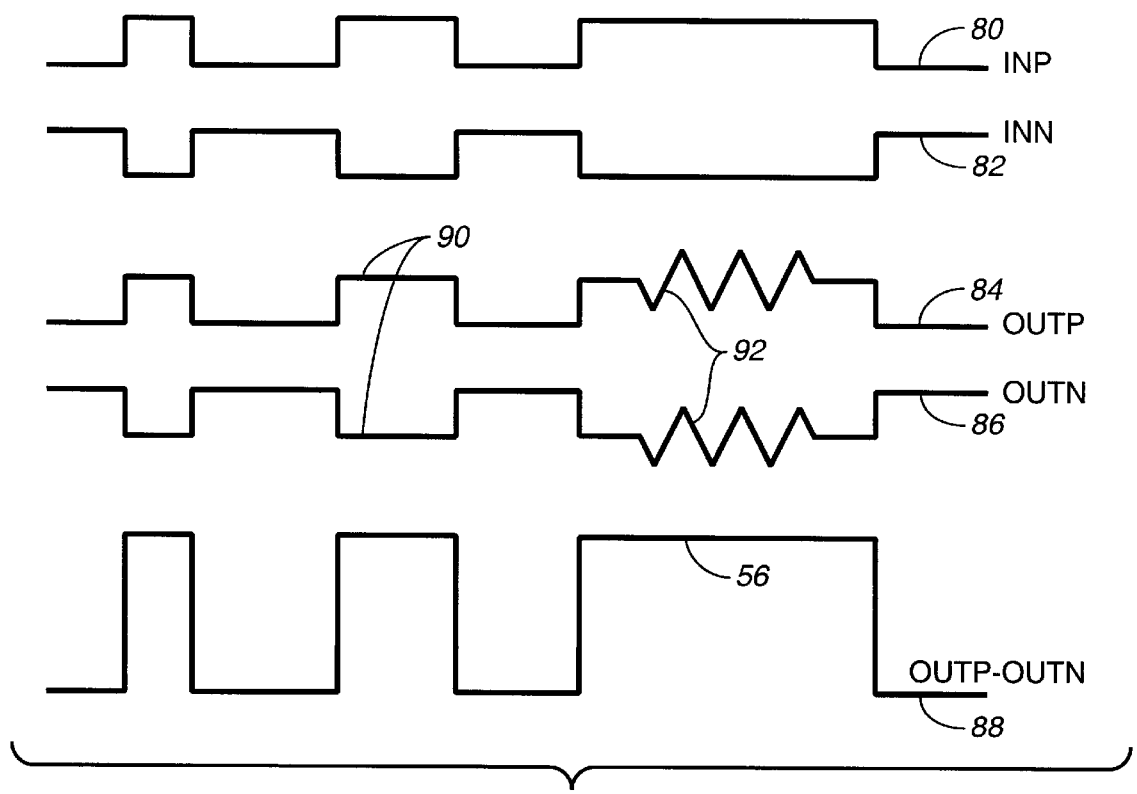
FIG._7

DIFFERENTIAL ACTIVE LOOP FILTER FOR PHASE LOCKED LOOP CIRCUITS

TECHNICAL FIELD

The present invention relates to loop filters used in phase locked loop (PLL) circuits.

BACKGROUND ART

A phase locked loop (PLL) is an electronic circuit that causes a particular system to track with a particular signal or circuit output. More specifically, a phase lock loop circuit generates periodic signals that have the same phase and frequency as a reference signal.

A PLL circuit of the prior art is shown in FIG. 4. Phase detector (PD) 14 compares a reference clock 12, such as, for example, a frequency synthesizer circuit, with a clock signal 30 generated by a voltage controlled oscillator (VCO) 28 and issues either an up pulse signal 16 or a down pulse signal 18, depending on whether the VCO 28 generated clock signal is leading or lagging the reference signal. The duration of the pulses corresponds to the magnitude of the differences. The charge pump 20 takes the up signals 16 and down signals 18 from the PD 14 and merges them into a bipolar pulse signal 22. The output signal 22 from the charge pump 20 contains a desirable DC component that is proportional to the phase difference between the VCO 28 generated clock signal 30 and the reference signal 12 and a series of AC components that contain undesirable noise. It is the duty of the loop filter 24 to eliminate the AC noise and to deliver a smooth voltage control signal 26 to the VCO 28. When the VCO 28 receives the voltage control signal 26, it adjusts the frequency of its output clock signal 30 accordingly so as to minimize the phase difference. While the PLL is in operation, this feedback process ensures that the clock signal from VCO 30 tracks the reference signal 12.

Conventionally, a loop filter used in a PLL circuit is either a passive or an active filter. U.S. Pat. No. 9,283,971 discloses a passive loop filter, which functions to short circuit pulses from the charge pump 20 to ground, to prevent them from appearing at the output. Such a type of passive loop filter, consisting of only passive elements such as resistors and capacitors, is inexpensive and simple to implement. However, modern PLL designers favor the use of active filters rather than the passive filters because active filters offer an additional benefit: an amplification of the input signal. The amplification is made possible by an operational amplifier employed in the active filter. As a result, the charge pump 20 only generates signals whose dynamic range is a fraction of the full dynamic range required by the VCO 28. This reduces the complexity of the charge pump 20 and minimizes the current mismatch of the charge pump circuit.

FIG. 5 shows an active filter disclosed in an article entitled "A 1.4 GHz Differential Low-Noise CMOS Frequency Synthesizer Using a Wideband PLL Application" that appeared in the year 2000 issue of *Proceeding of International Journal of Solid State Circuit*. The active filter is composed of an operational amplifier 46, a resistor 40, and a first 42 and second 44 capacitors. An input 48 feeds into the inverting input of the operational amplifier 46 while the non-inverting input of the operational amplifier is connected to AC ground 47. The output 49 of the operational amplifier 46 feeds back to the inverting input through two pathways in a parallel fashion: one through the first capacitor 42 and the resistor 40 connected in series and the other through the second capacitor 44.

Nevertheless, there are two shortcomings associated with the active filters of the prior art. Firstly, the resulting transfer function of a typical active filter, such as the filter shown in FIG. 5, has poles and zeros that are interrelated, as illustrated in the following transfer function equations:

$$\frac{V_o}{I} = -\frac{(1 + sC_1 R)}{s(C_1 + C_2)\left[1 + s\left(\frac{C_1 C_2}{C_1 + C_2}\right)R\right]} \quad (1)$$

Transfer Function of the active filter shown in FIG. 6.

$$s_z = -\frac{1}{C_1 R} \quad (2)$$

Transmission Zero (Transfer Function Zero) derived from equation 1.

$$s_p = -\frac{1}{\left(\frac{C_1 C_2}{C_1 + C_2}\right)R} \quad (3)$$

Natural Frequency (Transfer Function Pole) derived from equation 1.

In equation 2, the value of $s_z$ is determined by the resistor R 40 and the first capacitor C1 42, both of which are also present in the formula for $s_p$ in equation 3. Consequently, it is impossible for a PLL designer to change the value of $s_z$ without changing the value of $s_p$. This cross-interfering relationship is undesirable because the values of $s_z$ and $s_p$ have a direct influence on the shape of a filter's frequency response profile—they dictate the values of $f_z$ 50 and $f_p$ 52, which are inflection points of the filter frequency response shown in FIG. 6.

The band of frequencies between $f_z$ 50 and $f_p$ 52, known as unity gain frequency band 54, are of special interest to PLL circuit designers: a stable PLL can be obtained much more readily when the designer can manipulate the unity gain bandwidth 54 freely. With an active filter like the one depicted in FIG. 5, it is not easy for the PLL designer to come up with a highly stable PLL circuit. Accordingly, it is an objective of the present invention to improve loop filter design in a way such that the poles and zeros of the resulting transfer function can be manipulated freely, without cross interference.

Another shortcoming of a typical active filter of the prior art is that it is not immune to noise introduced by power supply and ground. Such interference is undesirable because it makes a PLL circuit less stable. Accordingly, another objective of the present invention is to provide a loop filter that can eliminate common mode noise from power supply and ground.

SUMMARY OF THE INVENTION

The above objectives have been met with a new type of loop filter, situated between a charge pump and a voltage controlled oscillator in a phase lock loop circuit, having three main components: two parallel filter modules in symmetric relation to a common mode feedback control differential comparator (CMFCDC). The filter modules perform the function of blocking off undesirable frequency from the incoming signals. Each filter module has one input port and one output port. The two input ports, one from each filter module, form a differential input pair, which are connected to the differential outputs of the charge pump. The two output ports, one from each filter module, are connected to a first and a second input port of CMFCDC, which has a total of three input ports. The third input port of the CMFCDC is connected to a reference voltage. The CMFCDC keeps the average output level of the two filter modules at the same voltage level as the reference voltage by issuing counter-balancing feedback signals to the filter modules in the event that they are not the same. Although the present invention is more complex than conventional systems, it enables the use of differential processing, which eliminates common mode noise.

The filter module of the above mentioned loop filter features two independent sets of passive elements that determine the poles and zeros of the filter. Because the present invention enables the PLL designer to adjust the values of poles and zeros of the filter independently, highly stable PLL circuit designs are readily realized.

BRIEF DESCRIPTION OF THE DRAWINGS

FIG. 1 is a block diagram of the differential active loop filter for a PLL of the present invention.

FIG. 2 is a diagram of a single-ended second order active filter module for use in the differential active loop filter of FIG. 1.

FIG. 3 is the circuit diagram of the differential active loop filter shown in FIG. 1.

FIG. 4 is a block diagram of a typical phase lock loop (PLL) circuit in accordance with the prior art.

FIG. 5 is a prior art low-pass active loop filter for use with a PLL circuit.

FIG. 6 shows frequency response of a typical second order low pass loop filter.

FIG. 7 are timing diagrams showing the manner in which the circuit of FIG. 1 eliminates common mode noise.

DETAILED DESCRIPTION OF THE PREFERRED EMBODIMENT

Referring to FIG. 1, the loop filter described herein includes a pair of differential inputs INP 60 and INN 62, a pair of differential outputs (64, 66), a pair of active filter modules 68 and 70, and a common mode feedback control differential comparator (CMFCDC) 74. The pair of differential inputs INP 60 and INN 62 feeds into the pair of active filter modules 68 and 70, each of which is made up of an operational amplifier and two sets of passive elements that determine the values of transmission zeros and natural frequencies of the active filter independently. The averaged output of these filters is compared to a reference voltage Vref 72 in the CMFCDC 74 and the resulting difference signal is amplified and sent back to the inputs of the filters 68 and 70 through feedback loops 76 and 78 so as to alter the outputs (64, 66) in such way that the subsequent common mode output voltage will match that of the reference voltage Vref 72.

It is the use of differential inputs and outputs that eliminates a prevalent noise type known as common mode noise, which is noise that affects the differential outputs OUTP 64 and OUTN 66, in the same way. In FIG. 7, plots 80 and 82 represent a pair of differential inputs that are free of noise. Common mode noise is introduced by power supply and ground connections as the input signals pass through the filter resulting in noisy differential output signals, such as those illustrated in 92 of plots 84 and 86. From plots 84 and 86, it is clear that the noise-free portion 90 of the output signals (84,86) is 180 degrees out of phase with its counter part to the differential pair, while the noisy portion 92 of the output signals (84,86) are in phase with its counterpart in the differential pair. Therefore, it is possible to eliminate the noise and to recover the original signal by taking the difference between the differential signals OUTP 84 and OUTN 86. As shown in plot 88, the subtraction doubles the value of the original waveform while it cancels out the noise, which results in a signal that closely resembles that of the original noise free signal.

The active filter module 68 of FIG. 1 is comprised of two sub-modules. In a preferred embodiment, as shown in FIG. 2, a passive filter sub-module 112 and an active filter sub-module 110 make up the complete filter 68. The passive filter sub-module 112, having a first resistor 104 and a first capacitor 106, contributes a pole, while the active filter sub-module 110, having a second resistor 100, a second capacitor 102, and an operational amplifier 108, contributes a zero and a pole at DC. In the combined filter 68, the pole can be modified by changing either the value of the first resistor 104 or the first capacitor 106, while the zero can be modified by changing either the value of the second resistor 100 or the second capacitor 102.

The combined filter 68 is a second order active filter whose transfer function equation is as follows:

$$\frac{V_o}{I} = -\frac{R_1(1 + sC_2R_2)}{sC_2R_2(1 + sC_1R_1)} \qquad (4)$$

Transfer Function of the active filter in the present invention $$s_z = -\frac{1}{C_2R_2} \qquad (5)$$

Transmission Zero (Zero) of the active filter in the present invention $$s_p = -\frac{1}{C_1R_1} \qquad (6)$$

Natural mode (Pole) of the active filter in the present invention

As it is clearly shown in equations 5 and 6, the pole and zero of the filter 68 are independent of one another. Consequently, if the PLL designer wants to expand the unity gain frequency band 54, he can easily do so by changing the values of the first resistor 104, the first capacitor 106, the second resistor 100, the second capacitor 102 or any combinations of them without any concern for cross interference.

In addition, due to the amplification effect provided by the operational amplifier 108 in the combined filter 68, the dynamic range of the input signal could be significantly reduced. Consequently, the charge pump 20, which generates the input signals, can be much simpler and will be less likely to suffer the current mismatch from the charge pump circuit.

In FIG. 3, a differential active loop filter according to the present invention is seen to have three inputs: INP 60, INN 62, and Vref 72. The circuit has two differential outputs: OUTP 64 and OUTN 66, one being the complement of the other. The circuit also has a first filter module 68 and a second filter module 70, which are identical, parallel, and mirror image of one another. The first active filter module 68 includes a first resistor 120, a second resistor 124, a first capacitor 122, a second capacitor 126, and a first operational amplifier 128. Differential input INP 60 connects to the non-inverting input of the first operational amplifier 128, which is also connected to Vref 72 through the first resistor 120 and the first capacitor 122 in a parallel fashion. The inverting input of the first operational amplifier 128 is the endpoint of two feedback loops. A first feedback loop 130 originates from the output of the first operational amplifier 128 and is connected to the inverting input of the first operational amplifier 128 through the second capacitor 126. A second feedback loop 132 originates from the output of a second operational amplifier 138 and it is connected to the inverting input of the first operational amplifier 128 through the second resistor 124. The first resistor 120 and the first capacitor 122 form a passive filtering sub-module 112 while the second resistor 124, the second capacitor 126 and the first operational amplifier 128 form an active filter sub-module 110. The passive filter 112 contributes a pole to the first active filter module 68 and its value is determined by the product of the value of the first resistor 120 and the value of the first capacitor 122. The active filter sub-module 110 contributed a zero, whose value is determined by the product of the second resistor 124 and the second capacitor 126. As a result, the pole and zero of the active filter sub-modules (68, 70) can be changed independently. Such flexibility enables a PLL loop designer to design PLL circuits that are highly stable.

A second active filter sub-module 70 is made just like the first active filter sub-module 68 with symmetric connections, namely, the input INN 62 in symmetric relation to input INP 60.

The function of the CMFCDC 74 is to keep the common mode voltage of OUTP 64 and OUTN 66 at the reference voltage level 72, which typically equals to the average of the supply voltage and the ground voltage. The averaging of OUTP 64 and OUTN 66 is performed by a third 134 and a fourth resistor 136, which are joined at a common node 140 to form a voltage divider circuit. The output of the first 68 and second active filters 70 is connected to the open ends of the voltage divider circuit. In the best mode of operation, the third resistor 134 has the same value as the fourth resistor 136 and thus, the common node voltage at 140 is equals to (OUTP+OUTN)/2. The second operational amplifier 138 acts as a comparator by taking one input from the common node 140 and another from Vref 72 and outputs their difference as an amplified signal. This signal is fed back to the inverting inputs of the first operational amplifier 128 and a third operational amplifier 142 by way of the second feedback loops 132 and a third feedback loop 146 through the second resistor 124 and a fifth resistor 144 respectively.

In the event that the voltage at the common node 140 is equal to Vref 72, the output of the second operational amplifier 138 will be null and nothing will happen. On the other hand, in the event that the voltage at the common node 140 is higher than Vref 72, such as in the case that a common mode noise has been introduced, the output of the second operational amplifier 138 will go high, thereby driving the inverting input of the first operational amplifier 128 and the third operational amplifier 142 high. Subsequently, both OUTP 64 and OUTN 66 will be driven low, thus bringing the overall common mode voltage average down towards Vref 72. By the same token, when the average voltage of OUTP 64 and OUTN 66 falls below Vref 72, the output of the second operational amplifier 138 goes low, driving both OUTP 64 and OUTN 66 high, raising the common mode voltage value towards that of Vref 72.

What is claimed is:

1. A loop filter circuit for a pair of differential input lines comprising:

a common mode feedback control differential comparator having first and second inputs, as well as a reference voltage input, and first and second outputs;

first and second active filters arranged in a parallel and symmetric relation, each having an input taken from a differential input line and having an output connected to one of the first and second inputs of the differential comparator, said differential comparator having its first and second outputs each connected to one of the first and second active filters, the outputs of the first and second active filters serving as differential output terminals for the circuit.

2. The loop filter of claim 1, wherein the first and second active filters each include:

an operational amplifier with an inverting input, a non-inverting input, and an output;

the non-inverting input being connected to one of the differential input lines and to the reference voltage through a first set of passive elements which dictates the values of a set of poles of the active filter;

the inverting input being connected to both the output of said feedback control comparator through a first passive element and the output of the operational amplifier through a second passive element, whereby the first and second passive elements form a second set of passive elements that affect the value of a set of transmission zeros of the active filter.

3. The loop filter of claim 2, wherein the first set of passive elements comprises a resistor and a capacitor connected in parallel.

4. The loop filter of claim 2, wherein a first passive element in the second set of passive element is a resistor and a second passive element is a capacitor.

5. The loop filter of claim 1, wherein the common mode feedback control differential comparator compares an average of the outputs of the first and second active filter with a reference signal and outputs a difference signal back to the inputs of the first and second active filters.

6. The loop filter of claim 5, wherein the common mode feedback control differential comparator comprises of a second operational amplifier having an inverting input, a non-inverting input and an output, said non-inverting input being connected to the outputs of the operational amplifier of each of the first and second active filters through a first and second resistors respectively.

7. The twin filter of claim 6, wherein the output of the second operational amplifier connects to the inverting inputs of the first and second active filters through a third and fourth resistor to provide a feedback input.

8. The twin filter claim 6, wherein the non-inverting input of the second operational amplifier is connected to the reference signal.

9. A twin filter circuit for a pair of differential input lines comprising:

a common mode feedback control differential comparator having first and second inputs, as well as a reference voltage input, and first and second outputs;

first and second active filters arranged in a parallel and symmetric relation, each having an input taken from a differential input line and having an output connected to one of the first and second inputs of the differential comparator, said differential comparator having its first and second outputs each connected to one of the first and second active filters, the outputs of the first and second active filters serving as differential output terminals for the circuit;

wherein each of said first and second active filters include an operational amplifier with an inverting input, a non-inverting input, and an output, the non-inverting input being connected to one of the differential input lines and to the reference voltage through a first set of passive elements which dictates the values of a set of poles of the active filter, the inverting input being connected to both the output of said feedback control comparator through a first passive element and the output of the operational amplifier through a second passive element, whereby the first and second passive elements form a second set of passive elements that affect the value of a set of transmission zeros of the active filter, and said common mode feedback control differential comparator comprises of a second operational amplifier having an inverting input, a non-inverting input and an output, said non-inverting input being connected to the outputs of the operational amplifier of each of the first and second active filters through a first and second resistors respectively.

10. The twin filter of claim 9, wherein the first set of passive elements comprises a resistor and a capacitor connected in parallel.

11. The twin filter of claim 9, wherein a first passive element in the second set of passive element is a resistor and a second passive element is a capacitor.

12. The twin filter of claim 9, wherein the common mode feedback control differential comparator compares an average of the outputs of the first and second active filter with a reference signal and outputs a difference signal back to the inputs of the first and second active filters.

13. The twin filter of claim 9, wherein the output of the second operational amplifier connects to the inverting inputs of the first and second active filters through a third and fourth resistors to provide a feedback input.

14. The twin filter claim 10, wherein the non-inverting input of the second operational amplifier is connected to the reference signal.

* * * * *